(12) United States Patent
Yamai et al.

(10) Patent No.: US 10,564,010 B2
(45) Date of Patent: Feb. 18, 2020

(54) CAPACITIVE SENSOR

(71) Applicant: ALPS ALPINE CO., LTD., Ota-ku, Tokyo (JP)

(72) Inventors: Tomoyuki Yamai, Tokyo (JP); Yasuyuki Kitamura, Tokyo (JP); Yuta Hiraki, Tokyo (JP); Setsuo Ishibashi, Tokyo (JP); Mitsuo Bito, Tokyo (JP); Manabu Yazawa, Tokyo (JP)

(73) Assignee: ALPS ALPINE CO., LTD., Tokyo (JP)

( * ) Notice: Subject to any disclaimer, the term of this patent is extended or adjusted under 35 U.S.C. 154(b) by 0 days.

(21) Appl. No.: 15/642,605

(22) Filed: Jul. 6, 2017

(65) Prior Publication Data
US 2017/0307413 A1 Oct. 26, 2017

Related U.S. Application Data

(63) Continuation of application No. PCT/JP2015/080502, filed on Oct. 29, 2015.

(30) Foreign Application Priority Data

Jan. 16, 2015 (JP) .................................. 2015-007253

(51) Int. Cl.
*G01D 5/24* (2006.01)
*G01R 27/26* (2006.01)
*H03K 17/96* (2006.01)

(52) U.S. Cl.
CPC ........... *G01D 5/24* (2013.01); *G01R 27/2605* (2013.01); *H03K 17/962* (2013.01)

(58) Field of Classification Search
CPC ..... G01R 27/2605; G01R 15/16; G06F 3/044; G06F 3/041; G01D 5/24
(Continued)

(56) References Cited

U.S. PATENT DOCUMENTS 8,237,672 B2\* 8/2012 Jiang ..................... G06F 3/0416
257/222
8,243,030 B2\* 8/2012 Jiang ....................... G06F 3/044
313/336

(Continued)

FOREIGN PATENT DOCUMENTS

CN 102439551 5/2012
JP 2010-191504 9/2010
(Continued)

OTHER PUBLICATIONS

International Search Report for PCT/JP2015/080502 dated Dec. 8, 2015.
(Continued)

*Primary Examiner* — Christopher P McAndrew
(74) *Attorney, Agent, or Firm* — Hunton Andrews Kurth LLP

(57) ABSTRACT

A capacitive sensor includes a base material provided with a pattern of a light-transmissive conductive film. The light-transmissive conductive film contains metal nanowires. The pattern includes a detection pattern of a plurality of detection electrodes arranged with intervals, a plurality of lead-out wirings linearly extending in a first direction from corresponding ones of the detection electrodes, and a resistance-setting section connected to at least any one of the lead-out wirings and including a portion extending in a direction not parallel to the first direction.

8 Claims, 4 Drawing Sheets

(58) Field of Classification Search
USPC .......................................................... 324/658
See application file for complete search history.

(56) References Cited

U.S. PATENT DOCUMENTS

| | | | | |
|---|---|---|---|---|
| 2007/0206146 | A1* | 9/2007 | Wang | G02F 1/1345 |
| | | | | 349/151 |
| 2008/0252608 | A1 | 10/2008 | Geaghan | |
| 2009/0002338 | A1* | 1/2009 | Kinoshita | G06F 3/044 |
| | | | | 345/174 |
| 2010/0295814 | A1* | 11/2010 | Kent | G06F 3/044 |
| | | | | 345/174 |
| 2011/0298731 | A1 | 12/2011 | Fu et al. | |
| 2013/0181944 | A1* | 7/2013 | Lee | G06F 3/044 |
| | | | | 345/174 |
| 2015/0370379 | A1* | 12/2015 | Hayashi | G06F 3/044 |
| | | | | 345/174 |

FOREIGN PATENT DOCUMENTS

| | | |
|---|---|---|
| JP | 2012-33466 | 2/2012 |
| JP | 2014-157400 | 8/2014 |
| JP | 2014-182436 | 9/2014 |
| JP | 2015-018494 | 1/2015 |
| WO | 2009/060717 | 5/2009 |
| WO | 2015-005319 | 9/2014 |

OTHER PUBLICATIONS

Supplementary European Search Report for EP 15877931.4 dated Jul. 18, 2018.

\* cited by examiner

CAPACITIVE SENSOR

CLAIM OF PRIORITY

This application is a Continuation of International Application No. PCT/JP2015/080502 filed on Oct. 29, 2015, which claims benefit of Japanese Patent Application No. 2015-007253 filed on Jan. 16, 2015. The entire contents of each aforementioned application is incorporated herein by reference.

BACKGROUND OF THE INVENTION

1. Field of the Invention

The present invention relates to a capacitive sensor provided with a pattern of a light-transmissive conductive film containing metal nanowires.

2. Description of the Related Art

Japanese Unexamined Patent Application Publication No. 2010-191504 discloses a touch switch of a capacitive sensor including a transparent conductive film having a monolayer structure. The touch switch disclosed in Japanese Unexamined Patent Application Publication No. 2010-191504 is composed of a touch electrode section and a wiring section of a meshed metal wire extending from the touch electrode. This touch switch configuration can be realized in compact touch panels, but in large-size panels, a large number of thin and long wirings are required to be arrayed. In addition, since the wiring section is made of a metal wire, the electrical resistance of the wiring section increases with lengthening and thinning the wiring section.

In the touch panel described in Japanese Unexamined Patent Application Publication No. 2009-146419, a plurality of transparent conductive structures constituted of carbon nanotubes are formed on a surface of a substrate. In addition, conductive wires formed of indium tin oxide (ITO) extend from the conductive structures. However, the conductive wire made of ITO or the like has increased electrical resistance, and the detection sensitivity is decreased due to the electrical resistance of the conductive wire.

In order to solve such a problem, films containing metal nanowires have been studied as light-transmissive conductive films having low resistance.

However, a case using metal nanowires in a light-transmissive conductive film having a monolayer structure has a problem in that the electrostatic discharge (ESD) tolerance is low compared with the case of ITO. The reasons thereof are, for example, (1) a light-transmissive conductive film containing metal nanowires has low electrical resistance compared with ITO, (2) even in the same pattern, a larger amount of current readily flows in ESD, (3) metal nanowires express conductivity in nano-size connection and therefore melt at a lower temperature compared with the melting point of the bulk metal (melt with the heat when a lot of current flows in a short time), and (4) the actual volume itself being in a conductive state is small.

SUMMARY OF THE INVENTION

The present invention provides a capacitive sensor that can have sufficient ESD tolerance, even if a light-transmissive conductive film containing metal nanowires is employed.

In order to solve the above-mentioned problems, the capacitive sensor of the present invention includes a base material provided with a pattern of a light-transmissive conductive film. The capacitive sensor is characterized in that the light-transmissive conductive film contains metal nanowires and that the pattern includes a detection pattern of a plurality of detection electrodes arranged with intervals, a plurality of lead-out wirings linearly extending in a first direction from corresponding ones of the detection electrodes, and a resistance-setting section connected to at least any one of the lead-out wirings and including a portion extending in a direction not parallel to the first direction. According to such a configuration, the lead-out wiring provided with the resistance-setting section has higher electrical resistance and enhanced ESD tolerance, compared with the lead-out wirings not provided with the resistance-setting section.

In the capacitive sensor of the present invention, the resistance-setting section may have a fold-back pattern. In such a configuration, the electrical resistance can be enhanced by the wiring path elongated by the fold-back pattern.

In the capacitive sensor of the present invention, the plurality of the lead-out wirings may have an equal-interval region where the lead-out wirings are arrayed with a constant first pitch in a second direction orthogonal to the first direction, the fold-back pattern may be juxtaposed with the equal-interval region in the second direction, and the fold-back pattern may include a plurality of linear pattern portions linearly extending in the first direction.

In such a configuration, since the equal-interval region of the plurality of the lead-out wirings and the fold-back pattern are constituted of linear portions extending in the same direction, it is difficult to visually recognize the difference in the patterns even if the fold-back pattern is disposed.

In the capacitive sensor of the present invention, the width of each of the linear pattern portions is preferably the same as that of the corresponding lead-out wiring, and the pitch of the linear pattern portions in the second direction may be the same as the first pitch.

In such a configuration, the lines and the spaces of the equal-interval region of the lead-out wirings are substantially the same as those of the fold-back pattern, which makes visual recognition of the difference in the patterns further difficult.

In the capacitive sensor of the present invention, the first direction may be the direction toward an external terminal region from the detection pattern, the plurality of the detection electrodes may be arranged in the first direction, and the resistance-setting section may be at least connected to the lead-out wiring extending from the detection electrode closest to the external terminal region. According to such a configuration, the resistance-setting section is provided to the lead-out wiring having the lowest ESD tolerance, i.e., the lead-out wiring being the shortest from the detection electrode to the external terminal region, and the ESD tolerance can be therefore increased.

In the capacitive sensor of the present invention, the wiring patterns including the lead-out wirings extending from corresponding ones of the detection electrodes may have the same resistance values. According to such a configuration, the ESD tolerance of the wiring patterns extracted from corresponding ones of the detection electrodes can be equalized.

In the capacitive sensor of the present invention, the metal nanowires may include silver nanowires. According to such a configuration, the pattern of the light-transmissive conductive film containing silver nanowires can have enhanced ESD tolerance.

DESCRIPTION OF THE PREFERRED EMBODIMENTS

Figure 1:
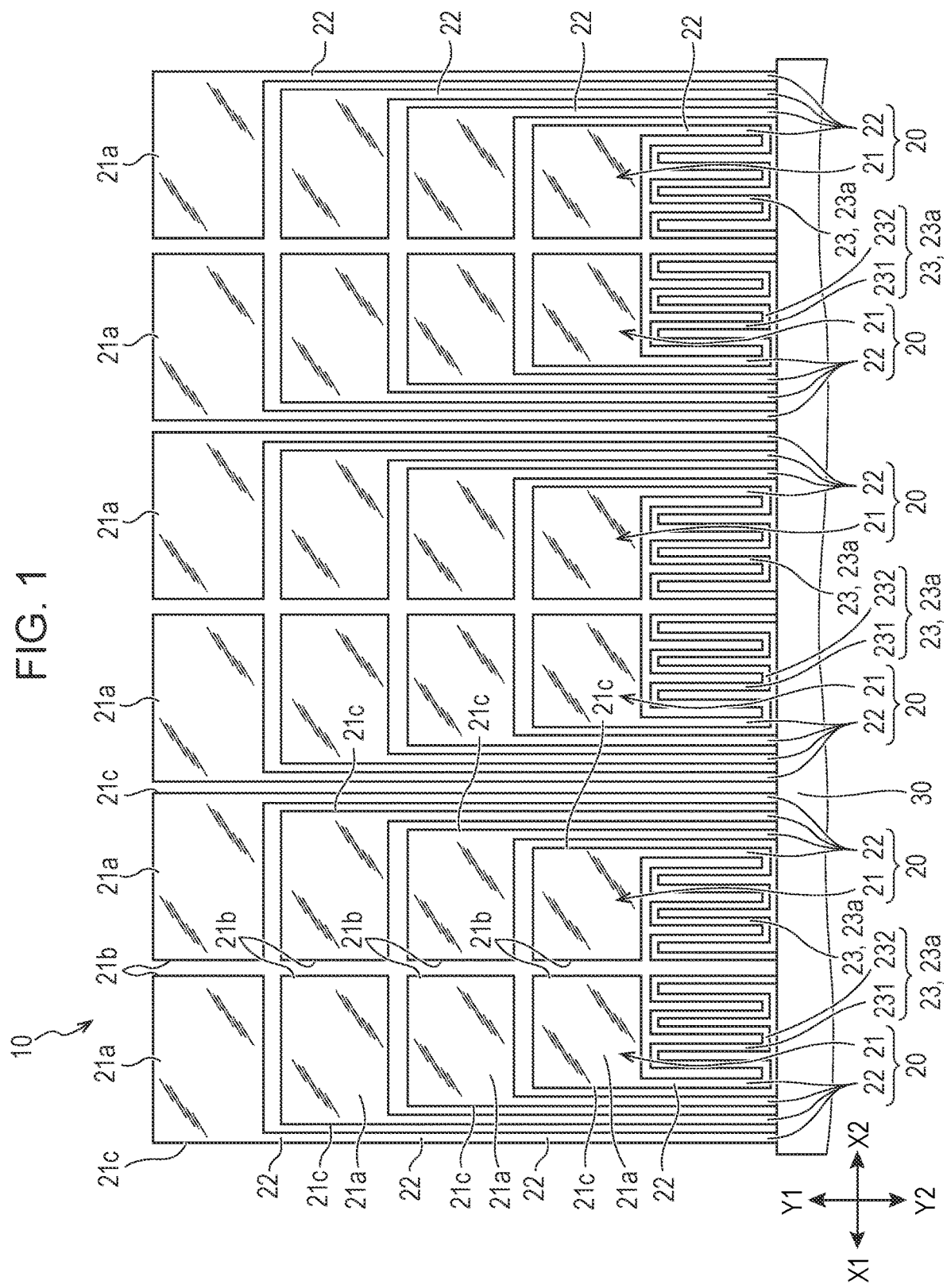
FIG. 1 is a plan view illustrating an example of the conductive pattern of a capacitive sensor according to an embodiment.

Embodiments of the present invention will now be described based on the drawings. In the following descriptions, the same members are designated with the same reference numerals, and explanations of members once described are appropriately omitted.

Configuration of Capacitive Sensor

FIG. 1 is a plan view illustrating an example of the conductive pattern of a capacitive sensor according to an embodiment.

As shown in FIG. 1, the capacitive sensor according to the embodiment has a configuration in which patterns 20 of a light-transmissive conductive film having a monolayer structure are provided on a base material 10. The patterns 20 each include a detection pattern 21, lead-out wirings 22, and a resistance-setting section 23.

The base material 10 may be made of any material. Examples of the material of the base material 10 include inorganic substrates having light transmissivity and plastic substrates having light transmissivity. The base material 10 may have any form. Examples of the form of the base material 10 include films, sheets, and plates, and the shape may have a flat surface or a curved surface. Examples of the material of the inorganic substrate include quartz, sapphire, and glass. Examples of the material of the plastic substrate include polyesters, such as polyethylene terephthalate (PET) and polyethylene naphthalate (PEN); polyolefins, such as polyethylene (PE), polypropylene (PP), and cycloolefin polymers (COPs); cellulose resins, such as diacetyl cellulose and triacetyl cellulose (TAC); acrylic resins, such as polymethyl methacrylate (PMMA); polyimides (PIs); polyamides (PAs); aramids; polyether sulfones; polysulfones; polyvinyl chlorides; polycarbonates (PCs); epoxy resins; urea resins; urethane resins; and melamine resins. The base material 10 may have a monolayer structure or may have a layered structure.

The detection pattern 21 includes a plurality of square detection electrodes 21a. The detection electrodes 21a are arranged at regular intervals in the X1-X2 direction (second direction) and the Y1-Y2 direction (first direction). The first direction and the second direction are orthogonal to each other. FIG. 1 is a schematic diagram for simplification, and the areas of the plurality of the detection electrodes 21a are equal to each other.

The plurality of the lead-out wirings 22 extend from the ends on the Y2 side of the plurality of the detection electrodes 21a so as to be parallel to each other along the same direction (Y1-Y2 direction). More specifically, the plurality of the lead-out wirings 22 extend from the ends of the detection electrodes 21a on the Y2 side of the second vertical sides 21c toward the external terminal region 30.

The resistance-setting section 23 is connected to at least any one of the plurality of the lead-out wirings 22. In the example shown in FIG. 1, the resistance-setting section 23 is connected to the lead-out wiring 22 extending from the detection electrode 21a closest to the external terminal region 30. In this case, the wiring pattern toward the external terminal region 30 from the detection electrode 21a closest to the external terminal region 30 is composed of a lead-out wiring 22 and a resistance-setting section 23. The resistance-setting section 23 shown in FIG. 1 has a fold-back pattern 23a. The fold-back pattern 23a includes a plurality of linear pattern portions 231 linearly extending in the Y1-Y2 direction and a plurality of connection pattern portions 232 connecting between the plurality of the linear pattern portions 231 alternately on the Y1 side and the Y2 side.

The fold-back pattern 23a is formed in a shape folded back at a constant pitch in the X1-X2 direction by the linear pattern portions 231 and the connection pattern portions 232. The end of the lead-out wiring 22 is connected to the end of the endmost linear pattern portion 231 via the connection pattern portion 232.

The current path of the wiring pattern toward the external terminal region 30 from the detection electrode 21a is elongated by disposing the resistance-setting section 23, compared with the case not disposing the resistance-setting section 23. The electrical resistance is enhanced with an increase in the current path. Accordingly, the lead-out wiring 22 provided with the resistance-setting section 23 has higher electrical resistance, compared with the case not disposing the resistance-setting section 23, and the ESD tolerance can be enhanced.

Figure 2A:
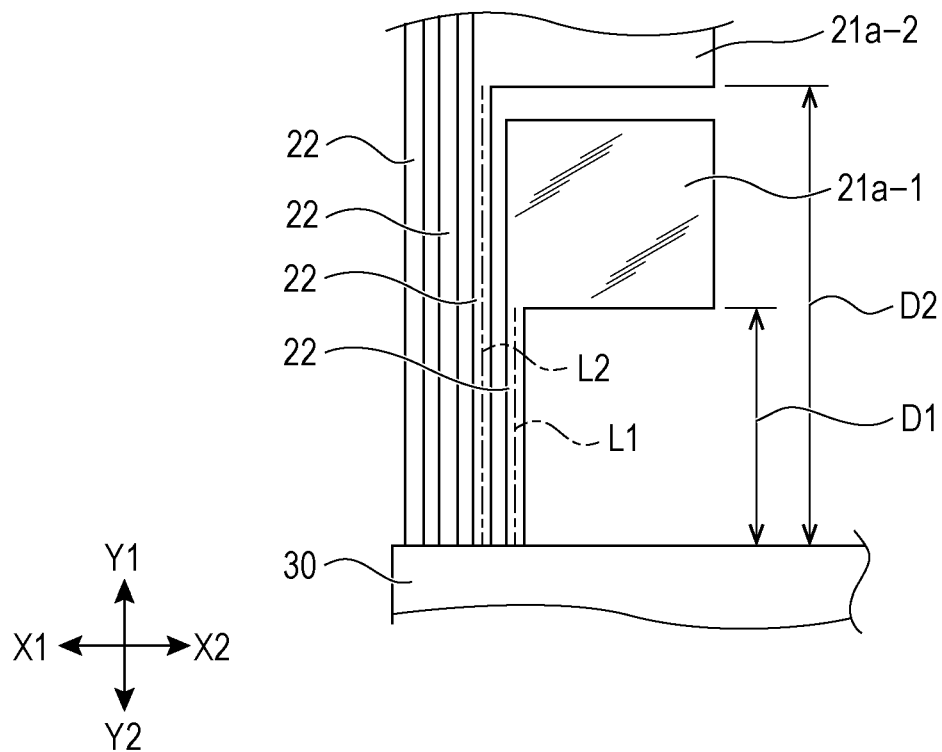
FIGS. 2A and 2B are schematic views showing examples of a relationship between detection electrodes and wiring lengths.
Figure 2B:
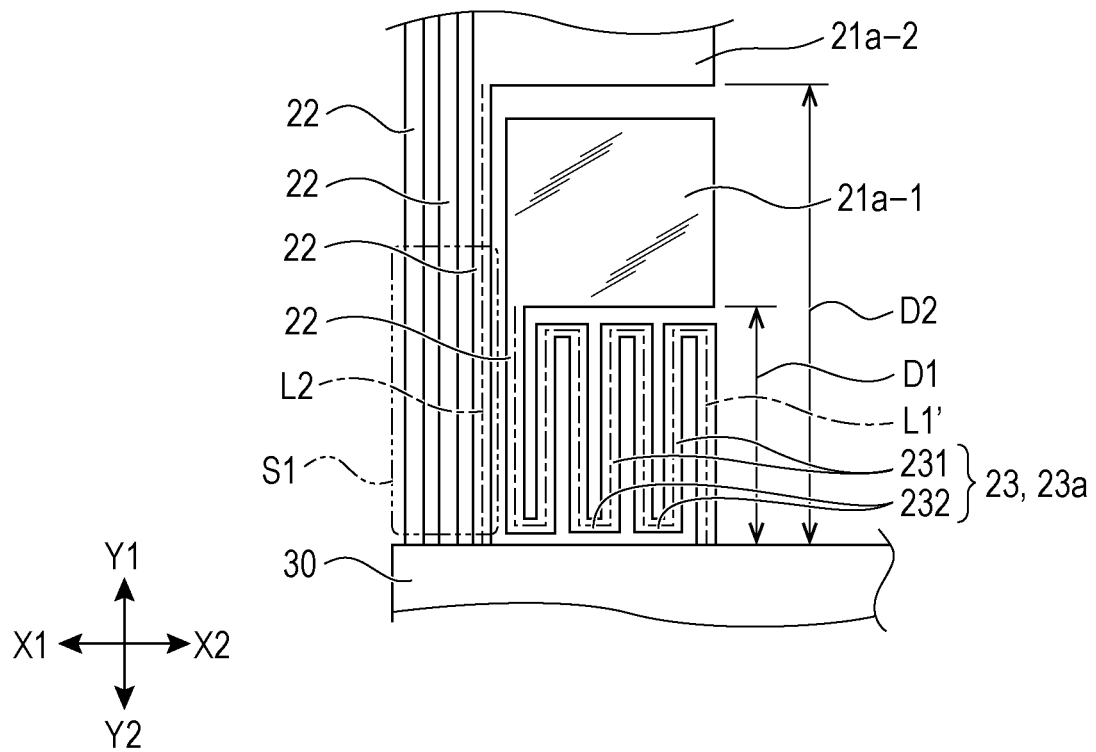

FIGS. 2A and 2B are schematic views showing examples of a relationship between detection electrodes and wiring lengths.

FIG. 2A shows a wiring pattern not including any resistance-setting section 23, and FIG. 2B shows a wiring pattern including a resistance-setting section 23. For convenience of explanation, FIGS. 2A and 2B each show only a part of the pattern 20.

Herein, in FIG. 2A, the distance from the end on the Y2 side of the detection electrode 21a-1 closest to the external terminal region 30 to the external terminal region 30 is denoted as D1; the length of the wiring pattern from the detection electrode 21a-1 to the external terminal region 30 is denoted as L1; the distance from the end on the Y2 side of the detection electrode 21a-2, which is farther from the external terminal region 30 than the detection electrode 21a-1, to the external terminal region 30 is denoted as D2; and the length of the wiring pattern from the detection electrode 21a-2 to the external terminal region 30 is denoted as L2. In FIG. 2A, the length of the wiring pattern is that of the lead-out wiring 22. When the resistance-setting section 23 is not disposed, the following relational expression (1) is satisfied:

$$D1/D2 = L1/L2 \tag{1}.$$

Similarly, in FIG. 2B, the distance from the end on the Y2 side of the detection electrode 21a-1 to the external terminal region 30 is denoted as D1; the wiring length from the detection electrode 21a-1 to the external terminal region 30 is denoted as L1'; the distance from the end on the Y2 side of the detection electrode 21a-2 to the external terminal region 30 is denoted as D2; and the wiring length from the detection electrode 21a-2 to the external terminal region 30 is denoted as L2. In FIG. 2B, the length of the wiring pattern is that of the lead-out wiring 22 or the sum of the length of the lead-out wiring 22 and the length of the resistance-setting section 23. When the resistance-setting section 23 is disposed, the following relational expression (2) is satisfied:

$$D1/D2 < L1'/L2 \quad (2).$$

When the length of the wiring pattern is determined so as to satisfy the relational expression (2), the ESD tolerance can be enhanced even in the detection electrode 21a-1 disposed near the external terminal region 30.

Herein, in the resistance-setting section 23 including the fold-back pattern 23a, the resistance-setting section 23 may be disposed so as to align with the equal-interval region S1 where the lead-out wirings 22 are aligned parallel to the Y1-Y2 direction. In the equal-interval region S1, the lead-out wirings 22 are arrayed with a constant pitch (first pitch) in the X1-X2 direction. As the fold-back pattern 23a, the pitch in the X1-X2 direction of the linear pattern portions 231 is preferably equal to the first pitch. As a result, the configuration is composed of the linear portions of the equal-interval region S1 of the lead-out wirings 22 and the fold-back pattern 23a extending in the same direction. Accordingly, even in observation from an angle at which the intensity of reflection/scattering from the pattern edges of the linear portion of the equal-interval region S1 is increased, the intensity of reflection/scattering in the linear pattern portions 231 of the fold-back pattern 23a is similarly increased. Consequently, the difference in ease of visual recognition is decreased, and the difference in pattern becomes difficult to be visually recognized even if the fold-back pattern 23a is disposed. In addition, since the lines and the spaces of the equal-interval region S1 of the lead-out wirings 22 are substantially the same as those of the fold-back pattern 23a, the difference in the intensity of reflection/scattering is further decreased, and the difference in the intensity of transmitted light is also decreased. Accordingly, the difference in pattern becomes further difficult to be visually recognized even if the fold-back pattern 23a is disposed.

Detection Operation

In the capacitive sensor according to the embodiment, capacitance is formed between adjacent ones of the plurality of the detection electrodes 21a. If a finger is brought into contact with or is brought near the surface of a detection electrode 21a, capacitance is formed between the finger and the detection electrode 21a near the finger. Accordingly, measurement of the current value detected from the detection electrodes 21a allows to detect which electrode of the plurality of the detection electrodes 21a is closest to the finger.

Constituent Material

The light-transmissive conductive film forming the pattern 20 contains conductive metal nanowires. The metal nanowires may be made of any material. Examples of the material of the metal nanowires include materials containing one or more metal elements selected from Ag, Au, Ni, Cu, Pd, Pt, Rh, Ir, Ru, Os, Fe, Co, and Sn. The metal nanowires may have any average minor axis diameter, and the average minor axis diameter of the metal nanowires is preferably larger than 1 nm and not larger than 500 nm. The metal nanowires may have any average major axis diameter, and the average major axis diameter of the metal nanowires is preferably larger than 1 μm and not larger than 1000 μm.

In order to improve the dispersibility of the metal nanowires in a nanowire ink forming the light-transmissive conductive film, the metal nanowires may be surface-treated with an amino group-containing compound, such as polyvinylpyrrolidone (PVP) and polyethyleneimine. The compound for the surface treatment is preferably used in an amount of not deteriorating the conductivity when formed into a coating film. In addition, a compound having a functional group and being adsorbable to a metal may be used as a dispersant. Examples of the functional group include a sulfo group (including sulfonate), a sulfonyl group, a sulfonamide group, a carboxylic acid group (including carboxylate), an amide group, a phosphoric acid group (including phosphate and phosphate ester), a phosphino group, a silanol group, an epoxy group, an isocyanate group, a cyano group, a vinyl group, a thiol group, and a carbinol group.

The dispersant for the nanowire ink may be of any type. Examples of the dispersant for the nanowire ink include water, alcohols (e.g., methanol, ethanol, n-propanol, i-propanol, n-butanol, i-butanol, sec-butanol, and tert-butanol), ketones (e.g., cyclohexanone and cyclopentanone), amides (e.g., N,N-dimethylformamide (DMF)), and sulfoxides (e.g., dimethylsulfoxide (DMSO)). The dispersant for the nanowire ink may be composed of one material or may be composed of a plurality of materials.

In order to prevent uneven drying of the nanowire ink and cracking, the evaporation rate of the solvent may be controlled by further adding a high boiling point solvent. Examples of the high boiling point solvent include butyl cellosolve, diacetone alcohol, butyl triglycol, propylene glycol monomethyl ether, propylene glycol monoethyl ether, ethylene glycol monoethyl ether, ethylene glycol monopropyl ether, ethylene glycol monoisopropyl ether, diethylene glycol monobutyl ether, diethylene glycol monoethyl ether, diethylene glycol monomethyl ether, diethylene glycol diethyl ether, dipropylene glycol monomethyl ether, tripropylene glycol monomethyl ether, propylene glycol monobutyl ether, propylene glycol isopropyl ether, dipropylene glycol isopropyl ether, tripropylene glycol isopropyl ether, and methyl glycol. The high boiling point solvents may be used alone or in combination of two or more thereof.

The binder material applicable to the nanowire ink can be widely selected from known transparent natural and synthetic polymer resins. For example, a transparent thermoplastic resin or a transparent curable resin that is cured by heat, light, electron beam, or radiation can be used. Examples of the transparent thermoplastic resin include polyvinyl chloride, vinyl chloride-vinyl acetate copolymers, polymethyl methacrylate, nitrocellulose, chlorinated polyethylene, chlorinated polypropylene, vinylidene fluoride, ethyl cellulose, and hydroxypropyl methyl cellulose. Examples of the transparent curable resin include melamine acrylate, urethane acrylate, isocyanate, epoxy resins, polyimide resins, and silicone resins, such as acrylic modified silicate. The nanowire ink may further contain an additive. Examples of the additive include surfactants, viscosity modifiers, dispersants, curing accelerating catalysts, plasticizers, and stabilizers, such as antioxidants and sulfidation inhibitors.

Other examples of resistance-setting section

Other examples of the resistance-setting section 23 will now be described.

Figure 3A:
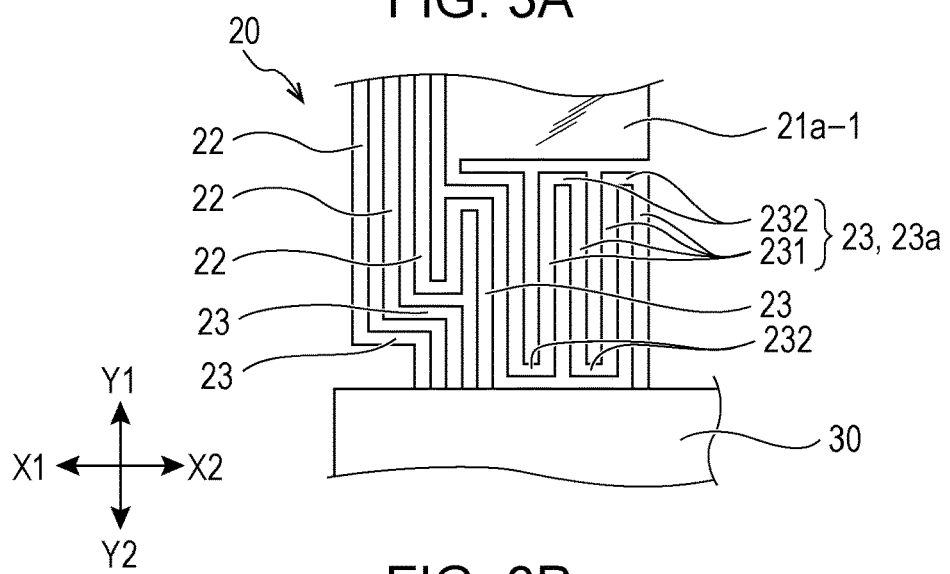
FIGS. 3A to 3C are plan views illustrating other examples of the resistance-setting section.
Figure 3B:
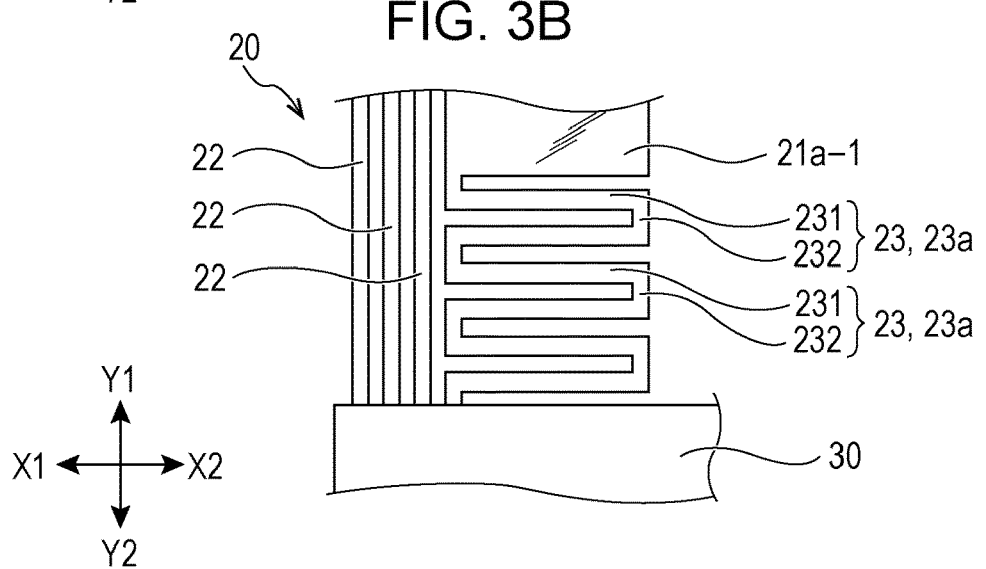
Figure 3C:
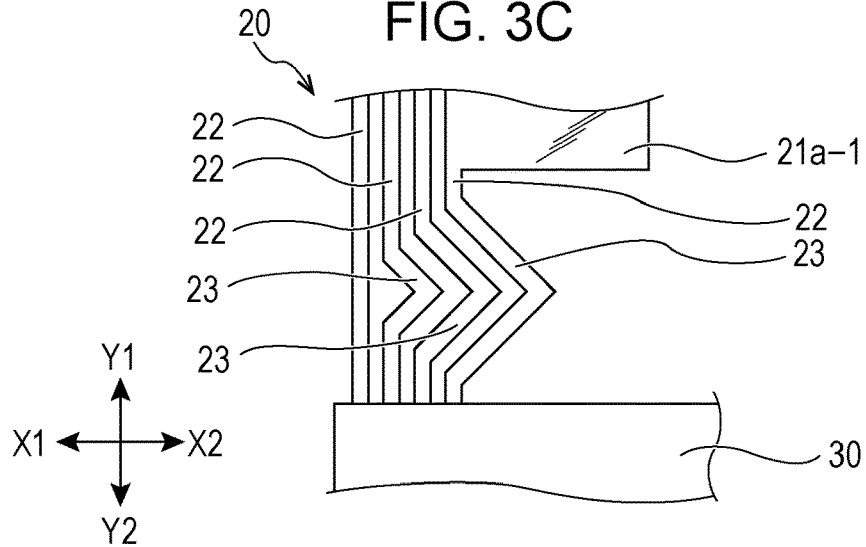

FIGS. 3A to 3C are plan views illustrating other examples of the resistance-setting section. For convenience of explanation, FIGS. 3A to 3C each show only a part of the pattern 20.

In the example shown in FIG. 3A, a resistance-setting section 23 is also provided to the lead-out wiring 22 of another detection electrode 21a in addition to the lead-out wiring 22 of the detection electrode 21a-1 closest to the external terminal region 30. In such a configuration, the wiring patterns of all detection electrodes 21a can have the same length and the variation in ESD tolerance can be suppressed.

In the example shown in FIG. 3B, the linear pattern portion 231 of the fold-back pattern 23a extends in the X1-X2 direction. That is, in the fold-back patterns 23a shown in FIG. 1 and FIG. 3B, the extending directions of the linear pattern portions 231 are different by 90° from each other.

In the example shown in FIG. 3C, the linear pattern portion 231 of the fold-back pattern 23a extends in directions not parallel to both the X1-X2 direction and the Y1-Y2 direction. Thus, the linear pattern portion 231 of the fold-back pattern 23a may extend in any direction and the fold-back pattern 23a may have any pattern shape, and the fold-back pattern 23a can function as a resistance-setting section 23, as long as the resistance value is increased by increasing the wiring length.

Figure 4:
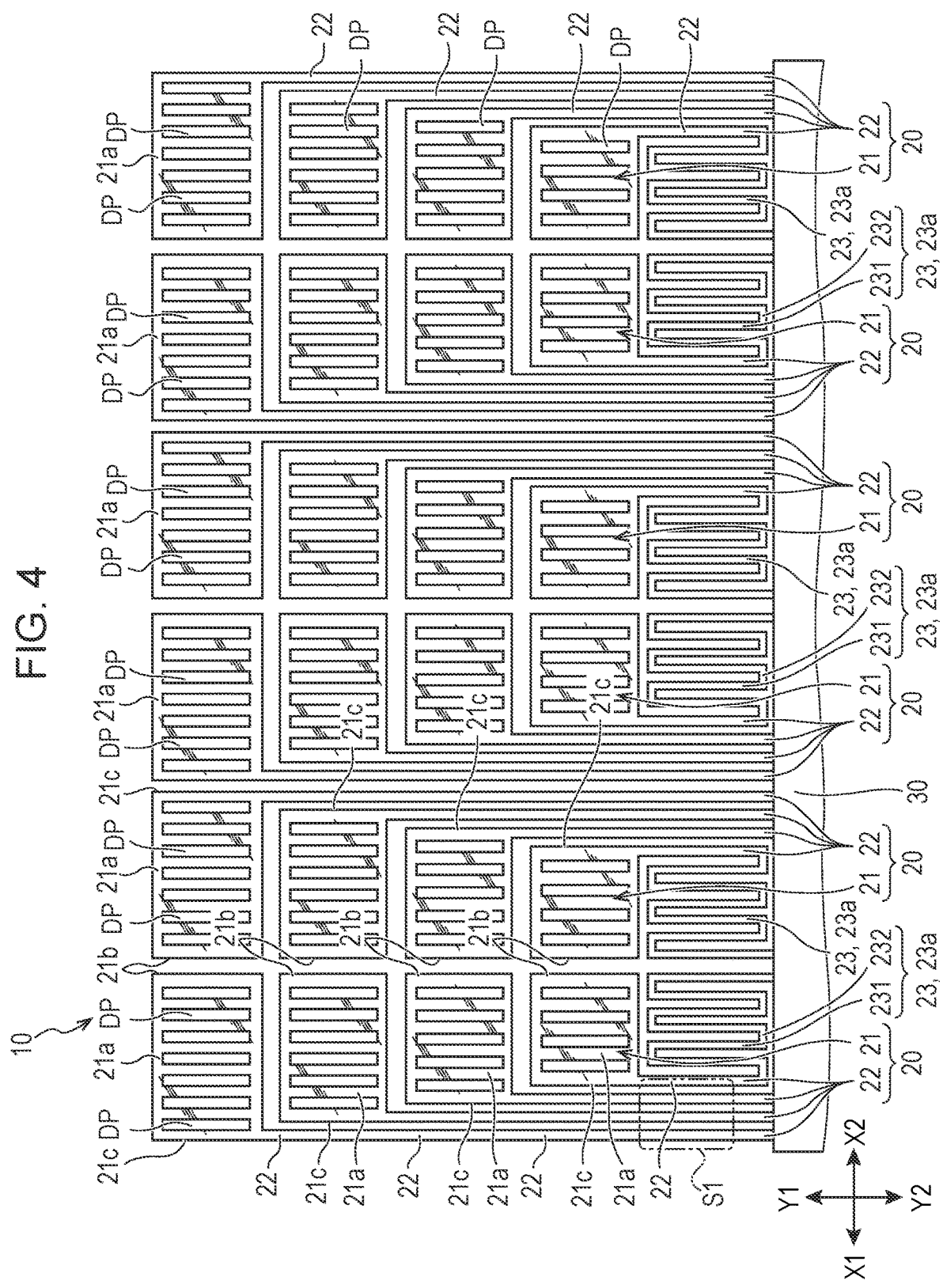
FIG. 4 is a plan view illustrating an example of a pattern including dummy patterns and resistance-setting sections.

FIG. 4 is a plan view illustrating an example of a pattern including dummy patterns and resistance-setting sections.

The dummy pattern DP is a slit-like pattern provided to each detection electrode 21a. The detection electrode 21a is provided with a plurality of dummy patterns DP extending in parallel to each other in the Y1-Y2 direction. A region of lines and spaces of the detection electrode 21a is thus formed.

When the dummy patterns DP are disposed, it is desirable that the width and the pitch of the lines and spaces in each detection electrode 21a formed by the dummy patterns DP coincide with the width and the pitch of the lines and spaces in the equal-interval region S1 of the plurality of the lead-out wirings 22. It is also desirable that the width and the pitch of the lines and spaces in the fold-back pattern 23a juxtaposed with the equal-interval region S1 coincide with the width and the pitch of the lines and spaces in the equal-interval region S1. Consequently, lines having the same width and spaces having the same width are disposed in the wide region of the entire pattern 20, which can make the pattern 20 inconspicuous.

Although embodiments and modification examples thereof have been described above, the present invention is not limited thereto. For example, those obtained by appropriate addition of components, deletion, or change in design of the above-described embodiments and modification examples thereof by those skilled in the art and those obtained by appropriate combinations of features of the embodiments and the modification examples are also included in the scope of the present invention as long as they have the gist of the present invention.

As described above, since the capacitive sensor according to the present invention has excellent ESD tolerance in spite of a monolayer structure, the sensor is useful for large touch panels including light-transmissive conductive films, and a light-transmissive pattern that is hardly visually recognized by a user can be formed.

What is claimed is:

1. A capacitive sensor comprising:
a base material provided with a pattern of a light-transmissive conductive film, wherein
the pattern includes:
a detection pattern of a plurality of detection electrodes arranged with intervals;
a plurality of lead-out wirings linearly extending in a first direction from corresponding ones of the detection electrodes; and
a resistance-setting section connected to at least any one of the lead-out wirings including a portion extending in a direction not parallel to the first direction;
a plurality of pairs of one of the detection electrodes and one of the lead-out wirings extending from corresponding one of the detection electrodes are formed so as to be separated from each other, wherein
the light-transmissive conductive film contains metal nanowires,
the resistance-setting section is formed of a single wiring path and has a fold-back pattern,
the plurality of lead-out wirings have an equal-interval region where the plurality of lead-out wirings are arrayed with a constant first pitch in a second direction orthogonal to the first direction,
the fold-back pattern is juxtaposed with the equal-interval region in the second direction,
the fold-back pattern includes a plurality of linear pattern portions linearly extending in the first direction,
the plurality of detection electrodes are arranged at regular intervals in the first direction,
the linear pattern portions have the same widths as those of corresponding ones of the lead-out wirings, and
the pitch of the linear pattern portions in the second direction is equal to the first pitch.

2. The capacitive sensor according to claim 1, wherein the first direction is a direction toward an external terminal region from the detection pattern; and
the resistance-setting section is at least connected to the lead-out wiring extending from the detection electrode closest to the external terminal region.

3. The capacitive sensor according to claim 1, wherein the wiring patterns including the plurality of lead-out wirings extending from corresponding ones of the plurality of detection electrodes have the same resistance values.

4. The capacitive sensor according to claim 2, wherein the wiring patterns including the plurality of lead-out wirings extending from corresponding ones of the plurality of detection electrodes have the same resistance values.

5. The capacitive sensor according to claim 1, wherein the metal nanowires include silver nanowires.

6. The capacitive sensor according to claim 2, wherein the metal nanowires include silver nanowires.

7. The capacitive sensor according to claim 3, wherein the metal nanowires include silver nanowires.

8. The capacitive sensor according to claim 4, wherein the metal nanowires include silver nanowires.

* * * * *